(12) United States Patent
Chen et al.

(10) Patent No.: US 7,816,703 B2
(45) Date of Patent: Oct. 19, 2010

(54) LIGHT-EMITTING DIODE DEVICE AND MANUFACTURING METHOD THEREOF

(75) Inventors: Chao-Min Chen, Taoyuan Hsien (TW); Shih-Peng Chen, Taoyuan Hsien (TW); Ching-Chuan Shiue, Taoyuan Hsien (TW); Huang-Kun Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 32 days.

(21) Appl. No.: 12/269,407

(22) Filed: Nov. 12, 2008

(65) Prior Publication Data
US 2009/0152583 A1    Jun. 18, 2009

(30) Foreign Application Priority Data
Dec. 14, 2007    (TW) .............................. 96147919 A

(51) Int. Cl.
*H01L 33/00* (2010.01)
*H01L 21/00* (2006.01)

(52) U.S. Cl. .......... 257/98; 257/E33.067; 257/E25.032; 438/29; 438/69

(58) Field of Classification Search .................. 257/98, 257/E33.067, 99, 79, 103, E31.001, E25.032; 438/29, 98, 79, 22, 69, 72
See application file for complete search history.

(56) References Cited

U.S. PATENT DOCUMENTS

| | | | |
|---|---|---|---|
| 2004/0135166 A1* | 7/2004 | Yamada et al. | 257/103 |
| 2005/0087884 A1* | 4/2005 | Stokes et al. | 257/778 |
| 2005/0280022 A1* | 12/2005 | Ueda et al. | 257/103 |
| 2006/0138445 A1* | 6/2006 | Zhao et al. | 257/102 |
| 2006/0273341 A1* | 12/2006 | Lee et al. | 257/103 |
| 2007/0145381 A1* | 6/2007 | Unno et al. | 257/79 |

OTHER PUBLICATIONS

Sugawara et al., "High-brightness InGaAlP green light-emitting diodes", 1992, Applied Phys. Lett., vol. 61, No. 15, pp. 1775-1777.*

* cited by examiner

*Primary Examiner*—Thomas L Dickey
*Assistant Examiner*—Nikolay Yushin
(74) *Attorney, Agent, or Firm*—Muncy, Geissler, Olds & Lowe, PLLC

(57) ABSTRACT

A light-emitting diode device includes an epitaxial layer, a current blocking layer and a current spreading layer. The current blocking layer is disposed on one side of the epitaxial layer and contacts with a portion of the epitaxial layer. The current spreading layer is disposed on one side of the epitaxial layer and contacts with at least a portion of the current blocking layer.

26 Claims, 13 Drawing Sheets

LIGHT-EMITTING DIODE DEVICE AND MANUFACTURING METHOD THEREOF

CROSS REFERENCE TO RELATED APPLICATIONS

This Non-provisional application claims priority under 35 U.S.C. §119(a) on Patent Application No(s). 096147919 filed in Taiwan, Republic of China on Dec. 14, 2007, the entire contents of which are hereby incorporated by reference.

BACKGROUND OF THE INVENTION

1. Field of Invention

The invention relates to a light-emitting diode (LED) device and a manufacturing method thereof.

2. Related Art

A light-emitting diode (LED) device is a lighting device made of semiconductor materials. The LED device has the advantages of small size, low power consumption, no radiation, mercury-free, long lifetime, fast response speed and high reliability. With the continuous progress of the recent technology, the application range thereof covers the information, communication, customer electronics, vehicle, lighting and traffic sign.

With reference to FIG. 1, a conventional LED device 1 includes a substrate 11, an epitaxial layer 12, a buffer layer 14, an N-type electrode 16, a P-type electrode 17 and a transparent conductive layer 18. The buffer layer 14, epitaxial layer 12 and transparent conductive layer 18 are disposed on the substrate 11 in sequence.

The epitaxial layer 12 includes an N-type semiconductor layer 121, a light-emitting layer 122 and a P-type semiconductor layer 123 in sequence. The N-type semiconductor layer 121 is disposed on the buffer layer 14. The light-emitting layer 122 is disposed on the N-type semiconductor layer 121. The P-type semiconductor layer 123 is disposed on the light-emitting layer 122. The N-type electrode 16 is electrically connected to the transparent conductive layer 18 via the epitaxial layer 12, and the P-type electrode 17 are electrically connected to the transparent conductive layer 18.

In general, the voltage and current of the LED device 1 usually have an exponential relationship. When the N-type electrode 16 and the P-type electrode 17 are applied with a voltage larger than the threshold voltage, the current through the LED device 1 is increased sharply. At the same time, the LED device 1 starts to light.

However, in the conventional structure of the LED device 1, the current distribution is non-uniform and is concentrated in the area A. This will cause the exceed current density in local area, which affects the lighting efficiency and results in overheat of the local area. Moreover, the lifetime of the LED device 1 will be shortened.

SUMMARY OF THE INVENTION

In view of the foregoing, the invention is to provide a light-emitting diode (LED) device, which has uniform current distribution, and manufacturing method thereof.

To achieve the above, the invention discloses an LED device including an epitaxial layer, a current blocking layer and a current spreading layer. The current blocking layer is disposed on one side of the epitaxial layer and in contact with a portion of the epitaxial layer. The current spreading layer is disposed on the side of the epitaxial layer and in contact with a portion of the current blocking layer.

To achieve the above, the invention also discloses a manufacturing method of an LED device. The method includes the steps of: forming an epitaxial layer on a first substrate, forming a current blocking layer on the epitaxial layer, and forming a current spreading layer to cover the current blocking layer or a portion of the epitaxial layer.

In addition, the invention further discloses a manufacturing method of an LED device. The method includes the steps of: forming a first semiconductor layer on an epitaxial substrate, forming a light-emitting layer on the first semiconductor layer, forming a second semiconductor layer on the light-emitting layer, wherein the second semiconductor layer has a first micro-nano structure, removing a portion of the second semiconductor layer and a portion of the light-emitting layer to expose a portion of the first semiconductor layer, forming a current blocking layer to cover a portion of the second semiconductor layer, a portion of the light-emitting layer and a portion of the first semiconductor layer, and forming a current spreading layer to cover a portion of the second semiconductor layer and a portion of the current blocking layer.

As mentioned above, the LED device of the present invention has the current blocking layer and current spreading layer, which are disposed adjacent to each other, so that the current distribution of the LED device can be homogenized. That is, the operating LED device of the present invention can have uniform current density so that the heat distribution can be homogenized. Therefore, the lighting efficiency of the LED device can be enhanced.

BRIEF DESCRIPTION OF THE DRAWINGS

The present invention will become more fully understood from the detailed description given herein below and accompanying drawings which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1:
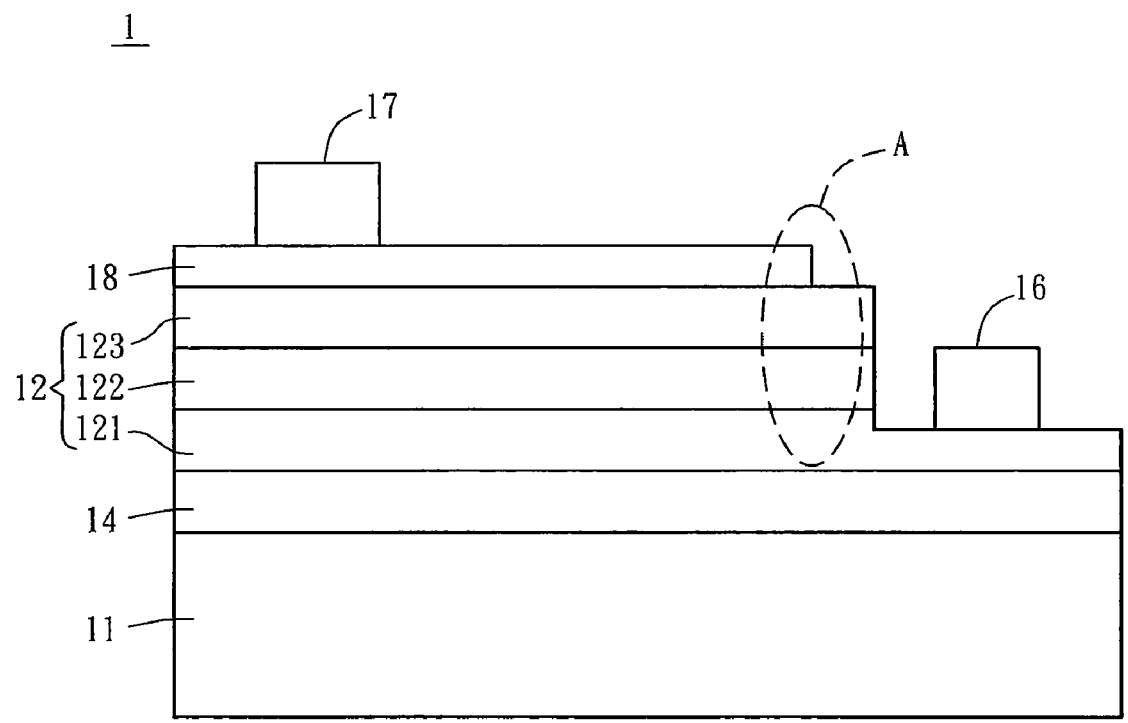
FIG. 1 is a schematic section view showing a conventional LED device.
Figure 2:
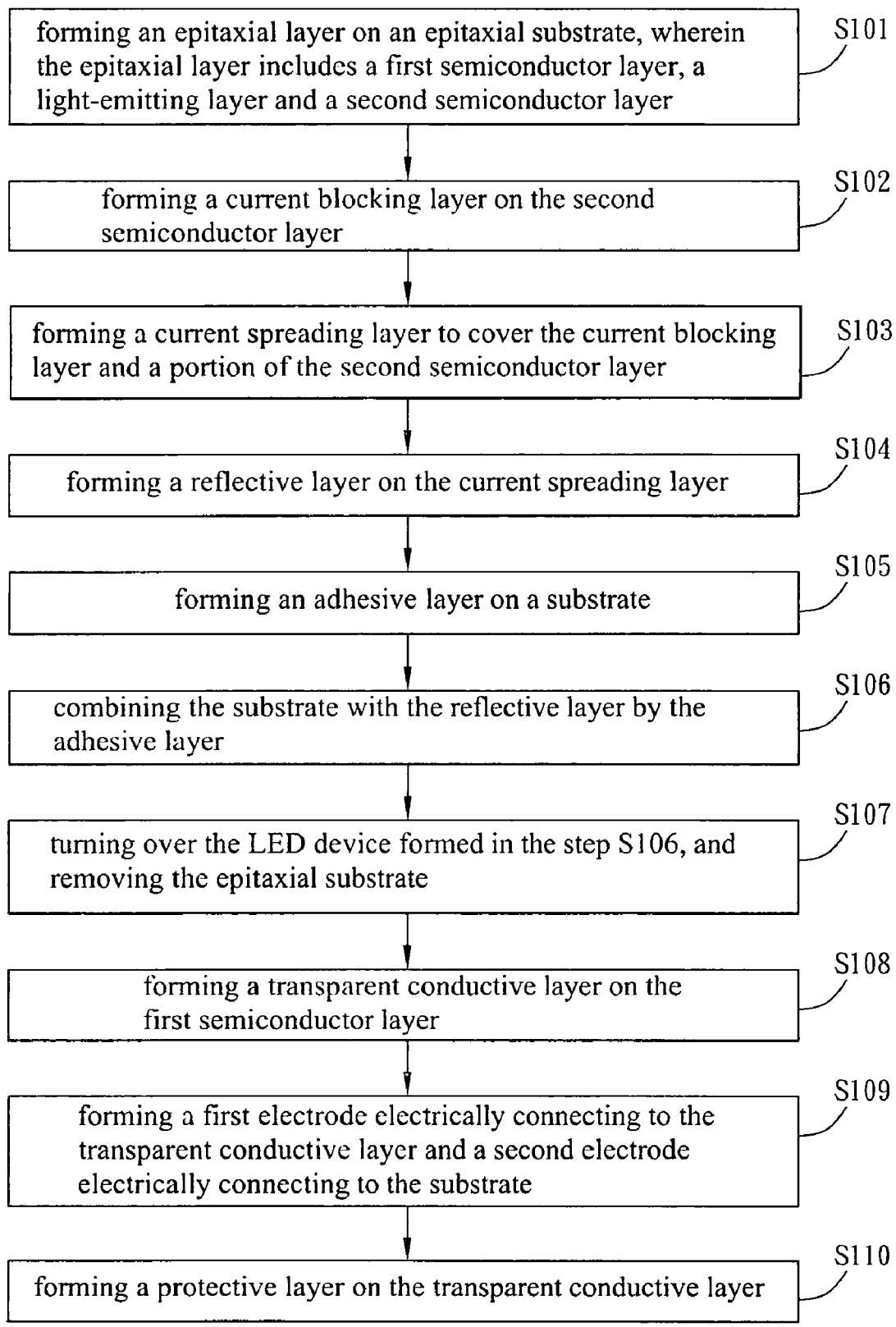
FIG. 2 is a flow chart showing a manufacturing method of an LED device according to a first embodiment of the present invention.

With reference to FIG. 2, a manufacturing method of a light-emitting diode (LED) device according to a first embodiment of the present invention includes the steps S101 to S110. Illustrations will be made by referring to FIG. 2 in conjunction with FIGS. 3A to 3I.

Figure 3A:
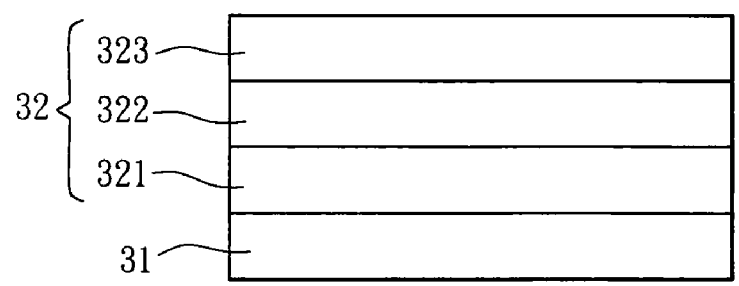
FIGS. 3A to 3I are schematic section views showing the steps of the manufacturing method in FIG. 2.

As shown in FIG. 3A, the step S101 is to form an epitaxial layer 32 on an epitaxial substrate 31. The epitaxial layer 32 includes a first semiconductor layer 321, a light-emitting layer 322 and a second semiconductor layer 323. The first semiconductor layer 321 is formed on the epitaxial substrate 31. Next, the light-emitting layer 322 is formed on the first semiconductor layer 321. Then, the second semiconductor layer 323 is formed on the light-emitting layer 322. The first semiconductor layer 321 and the second semiconductor layer 323 can be, for example but not limited to, an N-type epitaxial layer and a P-type epitaxial layer, respectively. Of course, the first semiconductor layer 321 and the second semiconductor layer 323 can be a P-type epitaxial layer and an N-type epitaxial layer, respectively.

Figure 3B:
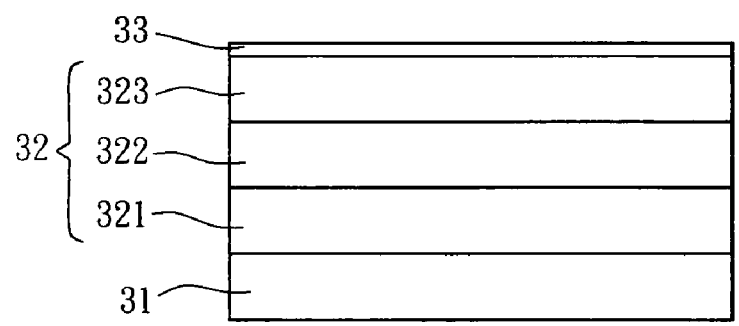
Figure 3C:
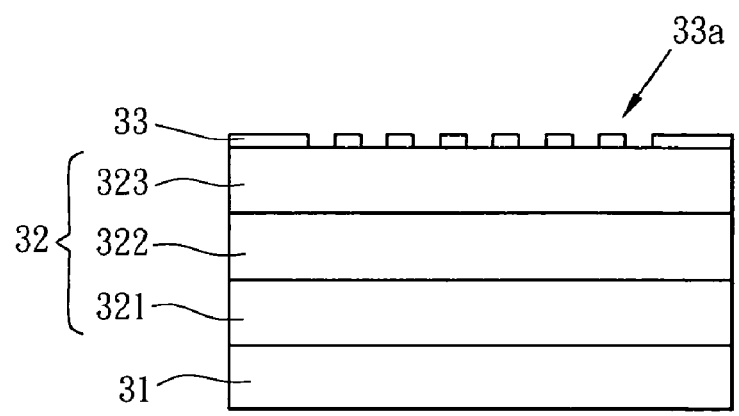

Referring to FIG. 3B, in the step S102, a current blocking layer 33 is formed on the second semiconductor layer 323. In the embodiment, as shown in FIG. 3C, a first micro-nano structure 33a of the current blocking layer 33 can be formed by way of, for example but not limited to, stacking, sintering, anodic aluminum oxidizing (AAO), nano-imprinting, hot pressing, transfer printing, etching or electron beam writer (E-beam writer) processing. The material of the current blocking layer 33 includes a dielectric material, such as nitride, oxide or carbide, or an insulating material with high thermal-conductive coefficient, such as aluminum nitride (AlN).

Figure 3D:
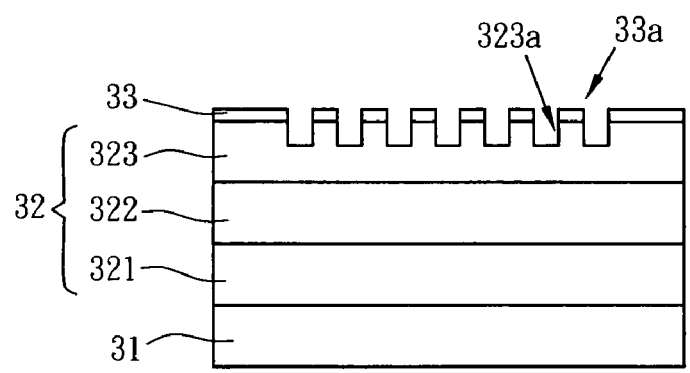

Then, as shown in FIG. 3D, the second semiconductor layer 323 is etched by using the first micro-nano structure 33a of the current blocking layer 33 as an etching stop layer by a thin-film process, a photolithograph process, an etching process, an electron beam writer (E-beam writer) processing, an anodic aluminum oxidizing (AAO) or micro-nano particles.

Herein, the current blocking layer 33 has the first micro-nano structure 33a, and the second semiconductor 323 has a second micro-nano structure 323a corresponding to the first micro-nano structure 33a. In the embodiment, both of the first and second micro-nano structures 33a, 323a include at least one nano-ball, nano-column, nano-hole, nano-point, nano-line, a nano-concave-convex structure, periodic hole or non-periodic hole.

Figure 3E:
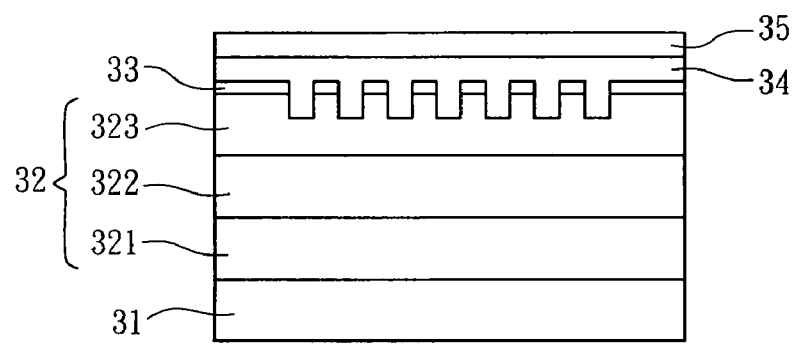

As shown in FIG. 3E, the step S103 is to form a current spreading layer 34 to cover the current blocking layer 33 and a portion of the second semiconductor layer 323. The material of the current spreading layer 34 can have high thermal conductivity, low manufacturing cost and high stability. For example, the material of the current spreading layer 34 can be indium tin oxide (ITO), nickel/aluminum alloy (Ni/Au), nickel oxide (NiOx), aluminum-doped zinc oxide (AZO), zinc gallium oxide (GZO), antimony tin oxide (ATO) or any kind of transparent conductive material.

In the step S104, a reflective layer 35 is then formed on the current spreading layer 34. The reflective layer 35 can be a metal reflective layer so that it can provide the reflection function and a preferred heat conducting path. In the embodiment, the material of the reflective layer 35 can be platinum (Pt), gold (Au), silver (Ag), palladium (Pd), nickel (Ni), chromium (Cr), titanium (Ti), chromium/aluminum alloy (Cr/Al), nickel/aluminum alloy (Ni/Al), titanium/aluminum alloy (Ti/Al), titanium/silver alloy (Ti/Ag), chromium/platinum/aluminum alloy (Cr/Pt/Al) or combinations thereof.

Alternatively, the reflective layer 35 can also be an optical reflective device composed of dielectric films with different refraction indexes, a metal reflective layer, a metal dielectric reflective layer or an optical reflective device composed of micro/nano balls. Thus, the reflective layer 35 can be formed by combining or stacking several different materials.

Figure 3F:
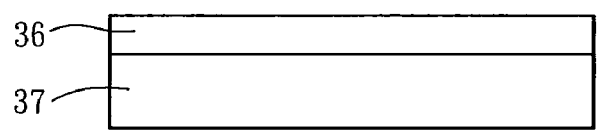

Referring to FIG. 3F, the step S105 is to form an adhesive layer 36 on a substrate 37, such as a conductive substrate or a metal substrate. The adhesive layer 36 can be a conductive adhesive layer capable of adhering at low temperature (lower than 400° C.), such as a pure metal, an alloy, an electroconductive material, a non-electroconductive material, solder, an organic material or any kind of conductive adhesive agent.

Figure 3G:
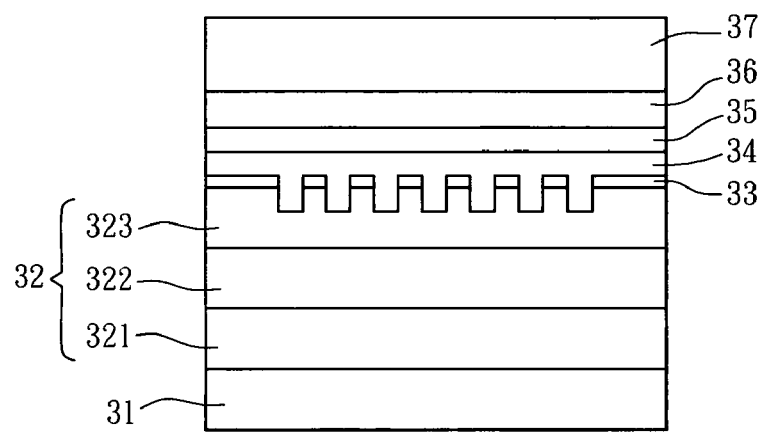
Figure 3H:
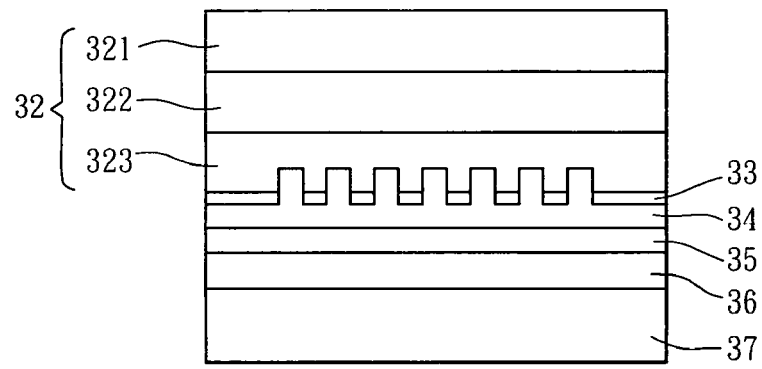

As shown in FIG. 3G, the substrate 37 is combined with the reflective layer 35 by the adhesive layer 36 in the step S106. In the step S107, the LED device 3 formed in the step S106 is turned over, and then the epitaxial substrate 31 is removed, as shown in FIG. 3H.

Figure 3I:
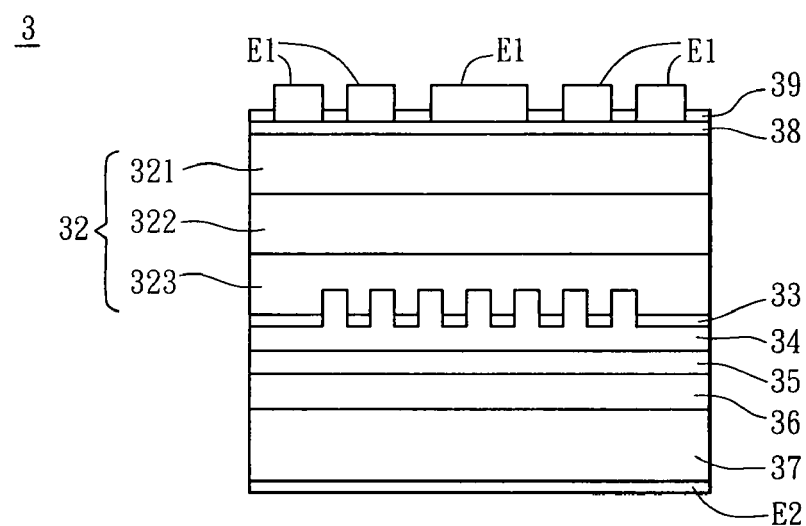

Referring to FIG. 3I, the step S108 is to form a transparent conductive layer 38 on the first semiconductor layer 321. In the embodiment, the material of the transparent conductive layer 38 can be indium tin oxide (ITO), aluminum-doped zinc oxide (AZO), nickel/aluminum alloy (Ni/Au), zinc oxide or zinc gallium oxide (GZO).

The step S109 is to form a first electrode E1 electrically connecting to the transparent conductive layer 38 and form a second electrode E2 electrically connecting to the substrate 37.

In the step S110, a protective layer 39 is formed on the transparent conductive layer 38 so that a LED 3 is formed. In the embodiment, the protective layer 39 is an anti-reflecting layer, which is made of micro-nano particles, nitride, oxide, carbide, a dielectric material or an insulating material with high thermoconductive coefficient. In practice, the micro-nano particle can be a nano-ball, which is formed on the protective layer 39 by way of, for example but not limited to, dip coating, spin coating or spray coating. By adjusting the material, size and refraction index of the micro-nano particles, the protective layer 39 can have a light-outputting surface with multiple functions of scattering, light-homogenizing, light-diffusing and anti-reflecting.

It is to be noted that the order of the above-mentioned steps can be changed according to the actual requirement.

Second Embodiment

Figure 4:
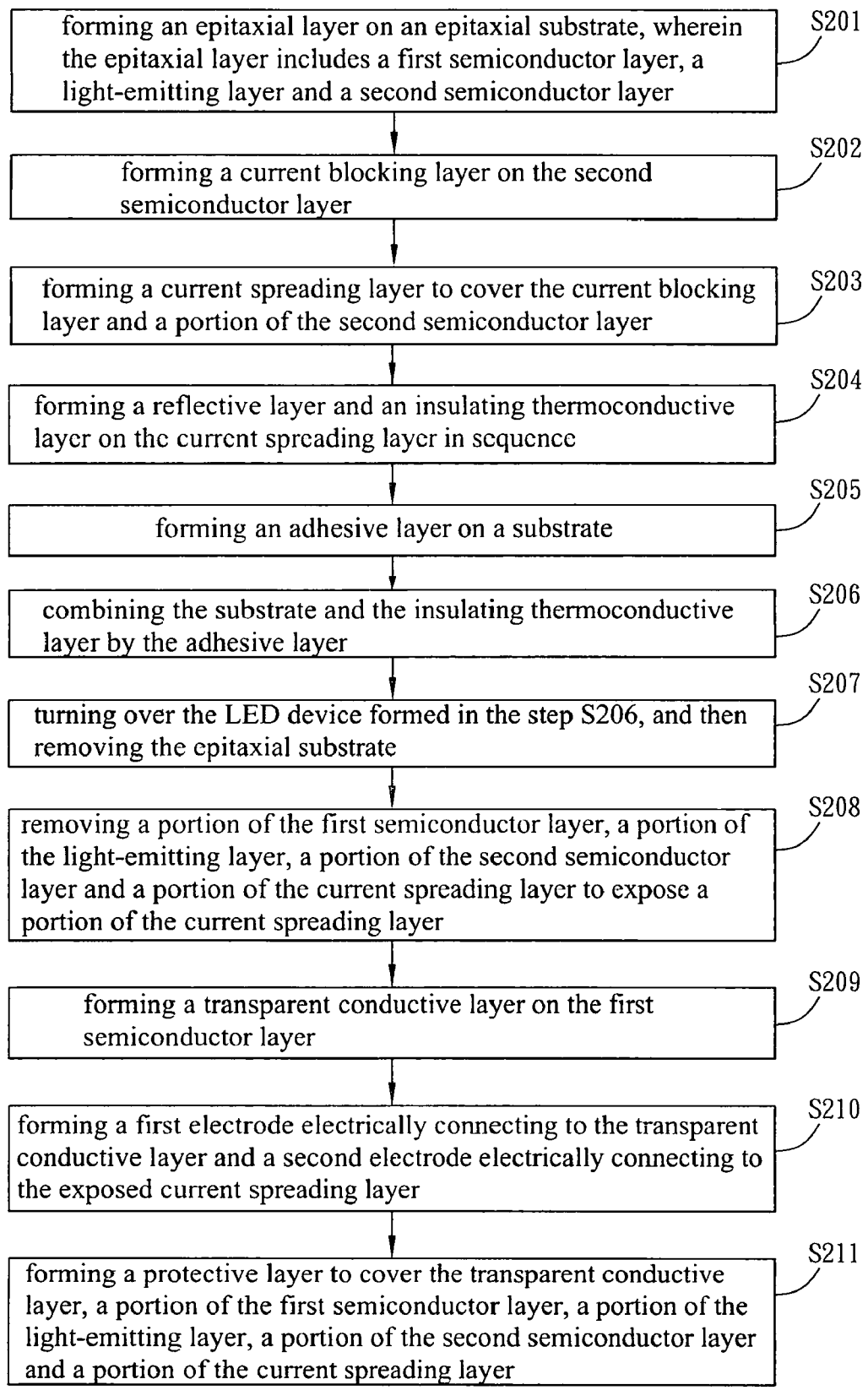
FIG. 4 is a flow chart showing a manufacturing method of an LED device according to a second embodiment of the present invention.

With reference to FIG. 4, a manufacturing method of a light-emitting diode (LED) device according to a second embodiment of the present invention includes the steps S201 to S211. Illustrations will be made by referring to FIG. 4 in conjunction with FIGS. 5A to 5J. Herein, the steps S201 to S203 as shown in FIGS. 5A to 5E are similar to the steps S101 to S103 of the first embodiment, so the detailed descriptions will be omitted.

In step S204, a reflective layer 35 is formed on the current spreading layer 34, and then an insulating thermoconductive layer 40 is formed on the reflective layer 35. In the embodiment, the material of the insulating thermoconductive layer 40 includes nitride, oxide, carbide, aluminum oxide, silicon carbide or any kind of dielectric materials.

Figure 5A:
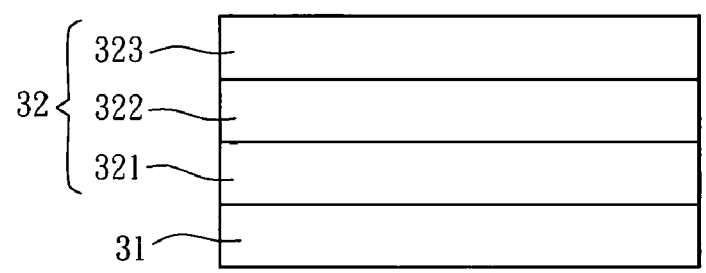
FIGS. 5A to 5J are schematic section views showing the steps of the manufacturing method in FIG. 4.
Figure 5B:
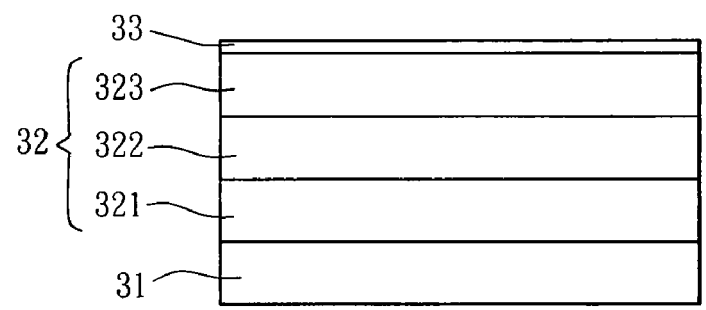
Figure 5C:
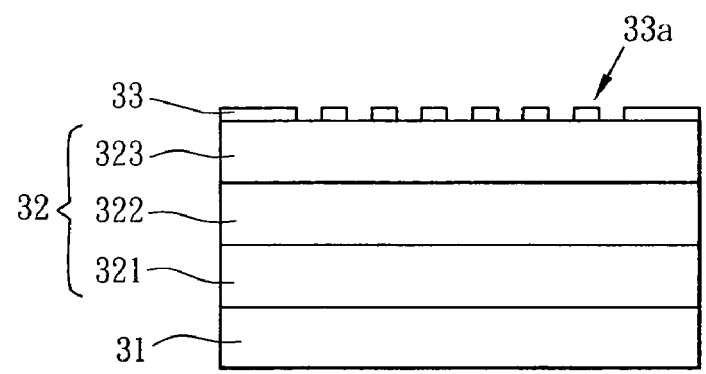
Figure 5D:
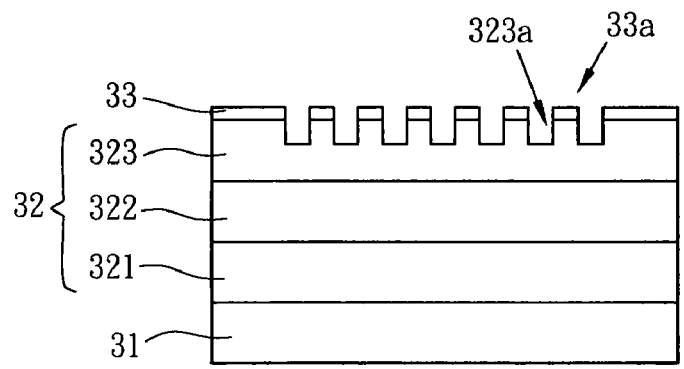
Figure 5E:
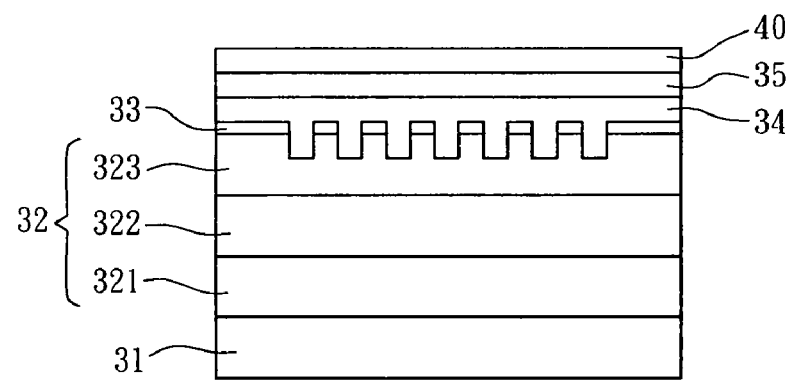
Figure 5F:
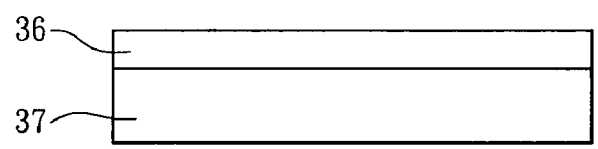

As shown in FIG. 5F, the step S205 is to form an adhesive layer 36 on a substrate 37. Herein, the material of the adhesive layer 36 is capable of adhering at low temperature and can be a non-conductive material, an organic material or any kind of adhesive agents. The substrate 37 can be a light permeable substrate, a heat-dissipating substrate, an insulating substrate, a heat-dissipating insulating substrate or a complex substrate.

Figure 5G:
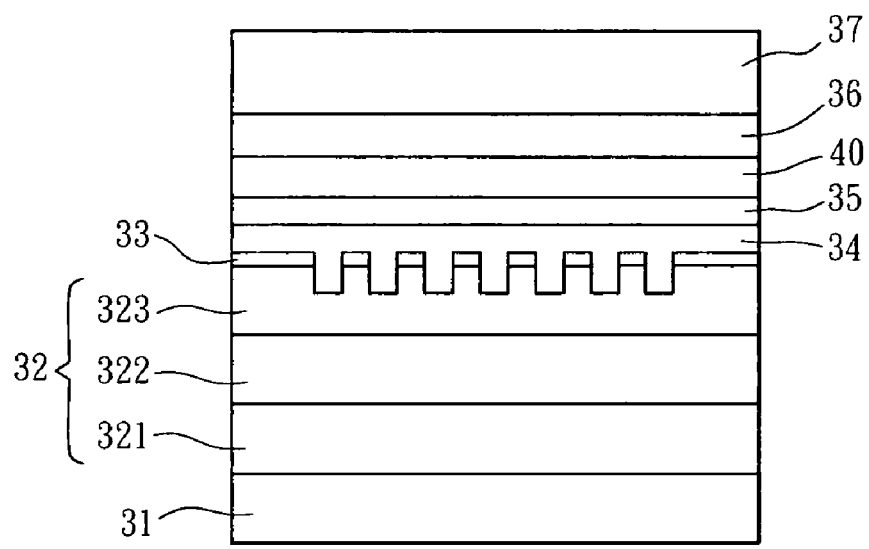
Figure 5H:
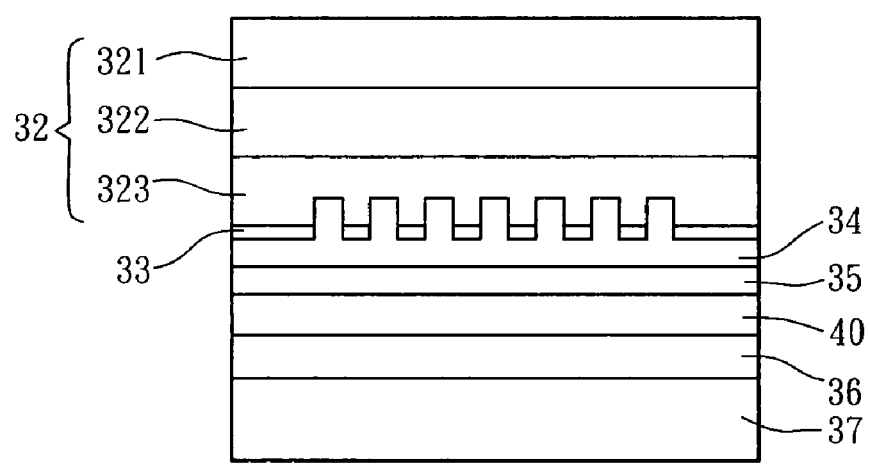

With reference to FIG. 5G, the substrate 37 and the insulating thermoconductive layer 40 are combined by the adhesive layer 36 in the step S206. As shown in FIG. 5H, the step S207 is to turn over the LED device formed in the step S206, and then remove the epitaxial substrate 31.

Figure 5I:
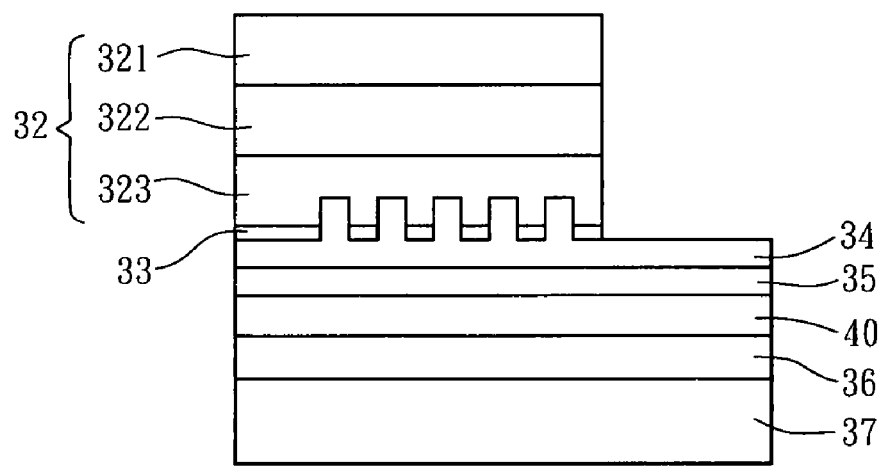

Referring to FIG. 5I, in the step S208, a portion of the first semiconductor layer 321, a portion of the light-emitting layer 322, a portion of the second semiconductor layer 323 and a portion of the current spreading layer 34 are removed so as to expose a portion of the current spreading layer 34.

Figure 5J:
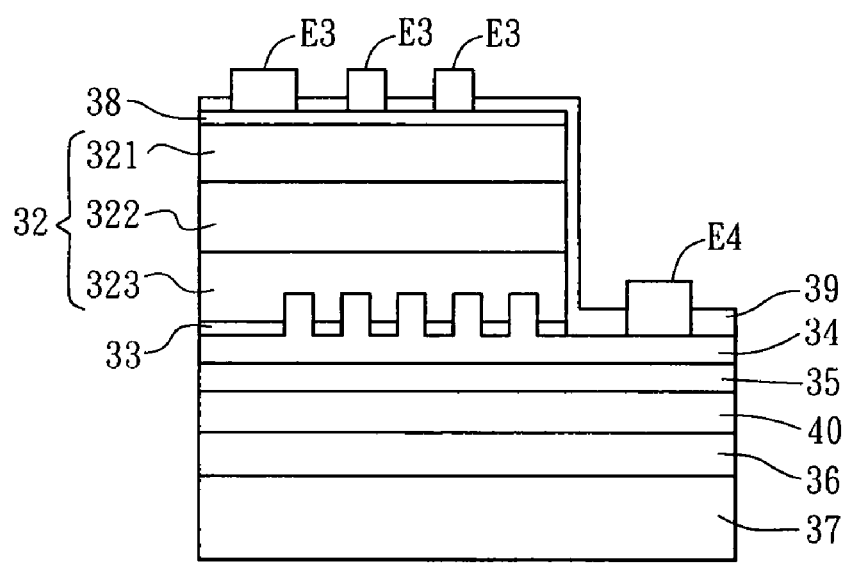

In the step S209, a transparent conductive layer 38 is formed on the first semiconductor layer 321 as shown in FIG. 5J. In the embodiment, the material of the transparent conductive layer 38 includes indium tin oxide (ITO), aluminum-doped zinc oxide (AZO), nickel/aluminum alloy (Ni/Au), zinc oxide or zinc gallium oxide.

Then, the step S210 is to form a first electrode E3 electrically connecting to the transparent conductive layer 38 and form a second electrode E4 electrically connecting to the exposed current spreading layer 34.

In the step S211, a protective layer 39 is formed on the transparent conductive layer 38 and a portion of the current spreading layer 34 so that the LED 4 is formed. In the embodiment, the protective layer 39 is an anti-reflecting layer, which is made of micro-nano particles, nitride, oxide, carbide, a dielectric material or an insulating material with high thermoconductive coefficient. In practice, the micro-nano particle can be a nano-ball, which is formed on the protective layer 39 by way of, for example but not limited to, dip coating, spin coating or spray coating. By adjusting the material, size and refraction index of the micro-nano particles, the protective layer 39 can have a light-outputting surface with multiple functions of scattering, light-homogenizing, light-diffusing and anti-reflecting.

It is to be noted that the order of the above-mentioned steps can be changed according to the actual requirement.

Third Embodiment

Figure 6:
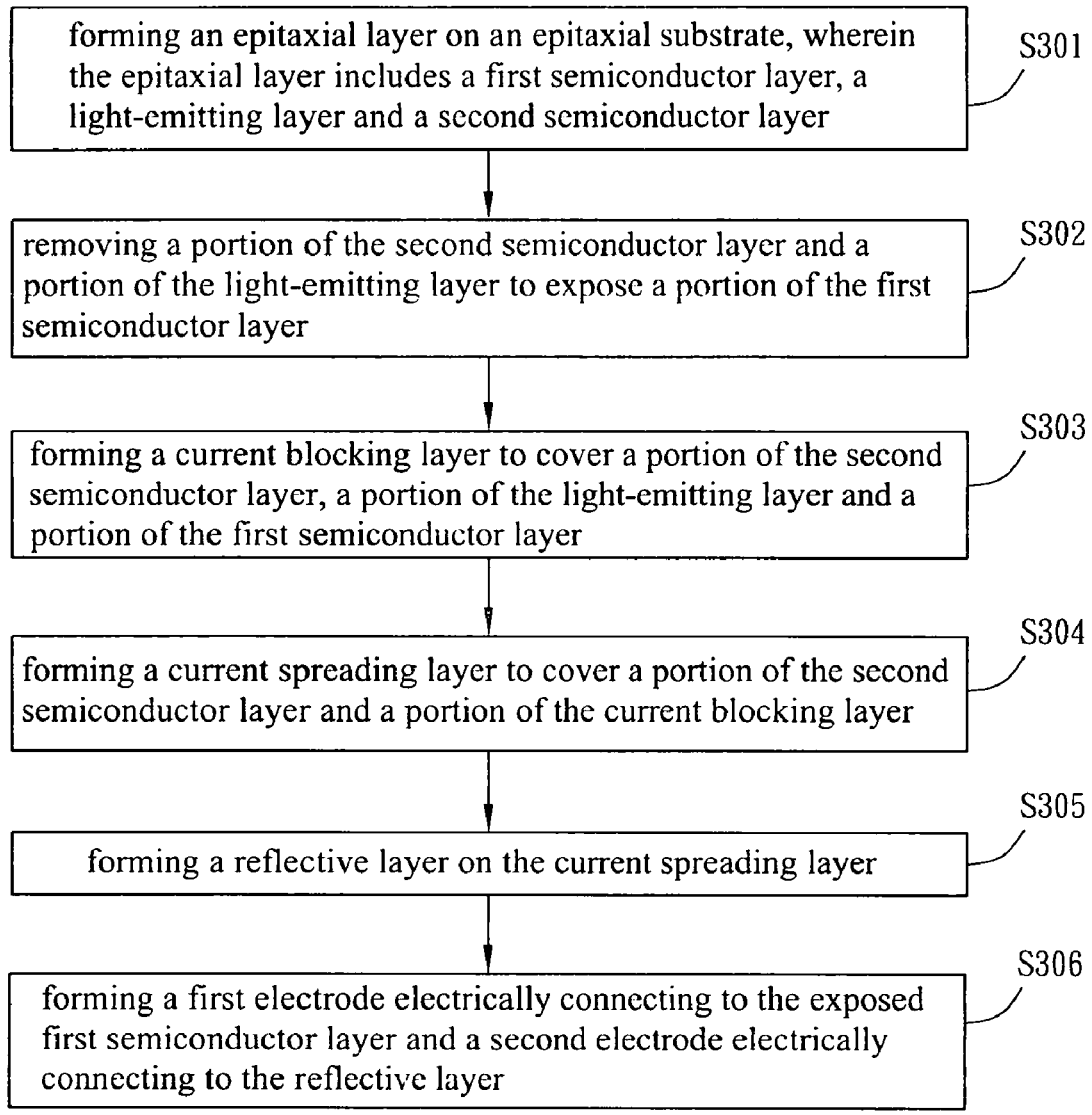
FIG. 6 is a flow chart showing a manufacturing method of an LED device according to a third embodiment of the present invention.
Figure 7A:
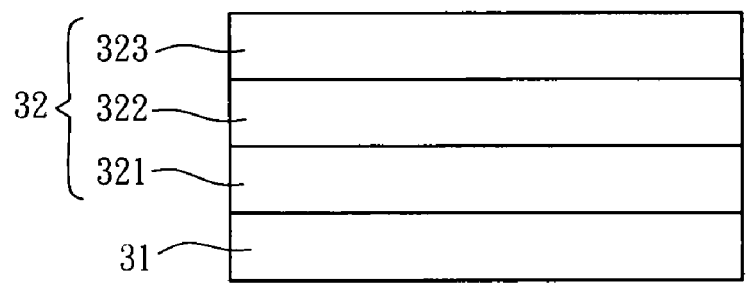
FIGS. 7A to 7E are schematic section views showing the steps of the manufacturing method in FIG. 6.

With reference to FIG. 6, a manufacturing method of a light-emitting diode (LED) device according to a third embodiment of the present invention includes the steps S301 to S306. Illustrations will be made by referring to FIG. 6 in conjunction with FIGS. 7A to 7E. Herein, the illustration with reference to FIG. 7A is similar to that described in the previous embodiment, so the detailed descriptions will be omitted.

Figure 7B:
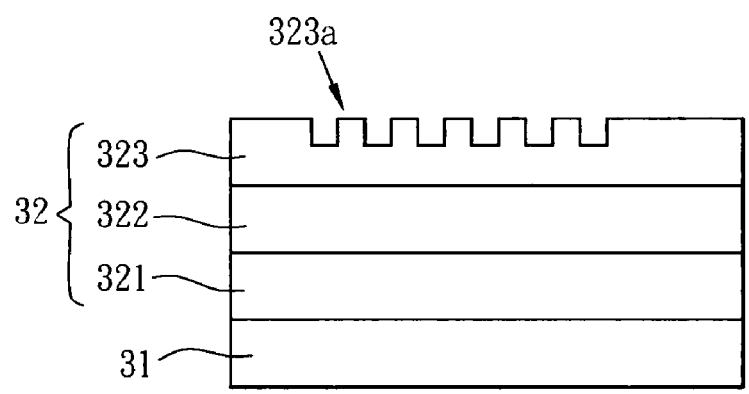

In the embodiment, the second semiconductor layer 323 is formed on the light-emitting layer 322 and is etched by a thin-film process, a photolithograph process, an etching process, an electron beam writer (E-beam writer) processing, an anodic aluminum oxidizing (AAO) or using micro-nano particles to the first micro-nano structure 323a as shown in FIG. 7B.

The first micro-nano structure 323a includes at least one nano-ball, nano-column, nano-hole, nano-point, nano-line, a nano-concave-convex structure, periodic hole or non-periodic hole. In the embodiment, the first micro-nano structure includes the nano-column, for example.

Figure 7C:
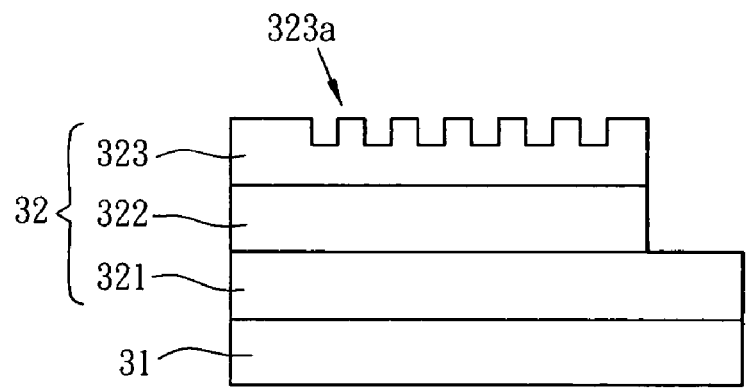

As shown in FIG. 7C, the step S302 is to remove a portion of the epitaxial layer 32. In details, a portion of the second semiconductor layer 323 and a portion of the light-emitting layer 322 are removed to expose a portion of the first semiconductor layer 321.

Figure 7D:
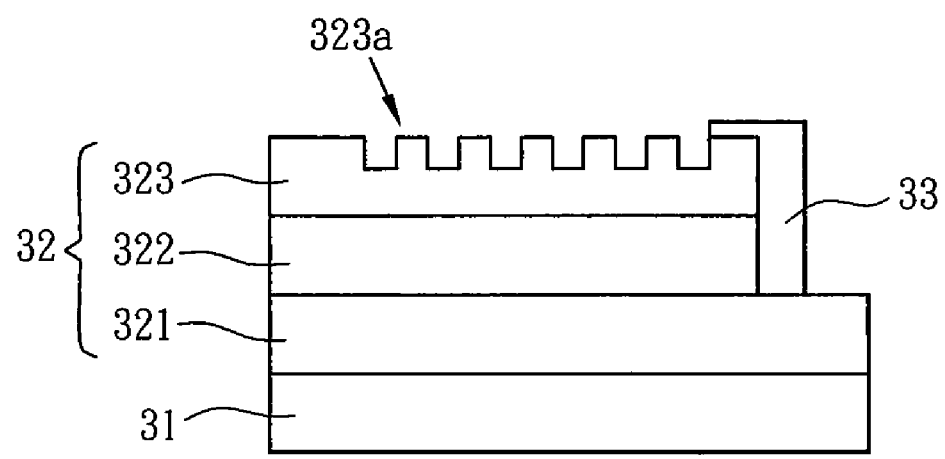

As shown in FIG. 7D, in the step S303, a current blocking layer 33 is formed on the second semiconductor layer 323. In the embodiment, the current blocking layer 33 can be formed on the second semiconductor layer 323 by way of, for example but not limited to, stacking, sintering, anodic aluminum oxidizing (AAO), nano-imprinting, hot pressing, transfer printing, etching or electron beam writer (E-beam writer) processing. Thus, the current blocking layer 33 covers a portion of the second semiconductor layer 323, a portion of the light-emitting layer 322 and a portion of the first semiconductor layer 321. The material of the current blocking layer 33 includes nitride, oxide or carbide.

Figure 7E:
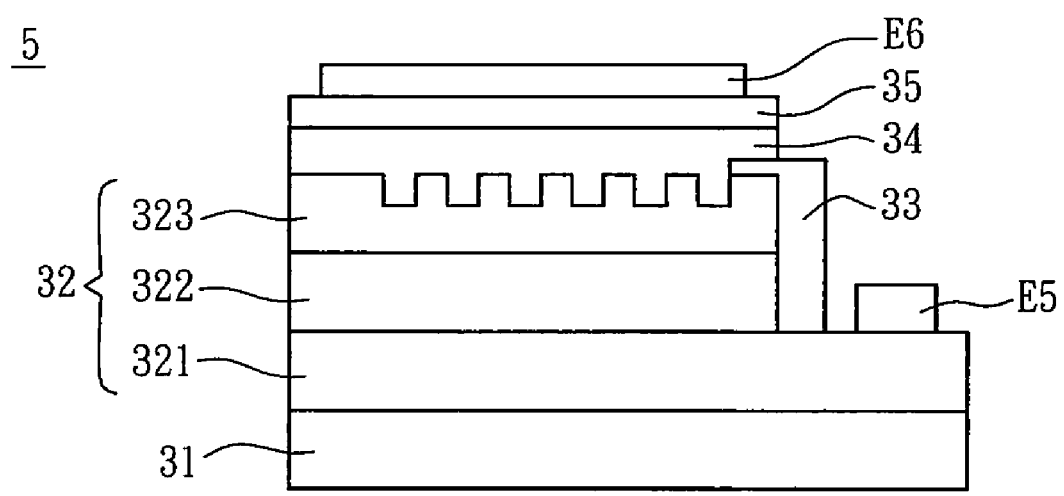

In the step S304, as shown in FIG. 7E, a current spreading layer 34 is formed to cover a portion of the second semiconductor layer 323 and a portion of the current blocking layer 33. The material of the current spreading layer 34 includes indium tin oxide (ITO), nickel/aluminum alloy (Ni/Au), nickel oxide (NiOx), aluminum-doped zinc oxide (AZO), zinc gallium oxide (GZO), antimony tin oxide (ATO) or any kind of transparent conductive material.

The step S305 is to form a reflective layer 35 on the current spreading layer 34. The reflective layer 35 can be a metal reflective layer, so that it can provide the reflection function and a preferred heat conducting path. In the embodiment, the material of the reflective layer 35 can be platinum (Pt), gold (Au), silver (Ag), palladium (Pd), nickel (Ni), chromium (Cr), titanium (Ti), chromium/aluminum alloy (Cr/Al), nickel/aluminum alloy (Ni/Al), titanium/aluminum alloy (Ti/Al), titanium/silver alloy (Ti/Ag), chromium/platinum/aluminum alloy (Cr/Pt/Al) or combinations thereof.

Alternatively, the reflective layer 35 can also be an optical reflective device composed of dielectric films with different refraction indexes, a metal reflective layer, a metal dielectric reflective layer or an optical reflective device composed of micro/nano balls. Thus, the reflective layer 35 can be formed by combining or stacking several different materials.

The step S306 is to form a first electrode E5 electrically connecting to the exposed first semiconductor layer 321 and form a second electrode E6 electrically connecting to the reflective layer 35 so as to form the LED device 5.

It is to be noted that the order of the above-mentioned steps can be changed according to the actual requirement.

In summary, the LED device of the present invention has the current blocking layer and current spreading layer, so that the current distribution of the LED device can be homogenized. That is, the operating LED device of the present invention can have uniform current density so that the heat distribution can be homogenized. Therefore, the lighting efficiency of the LED device can be enhanced.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A light-emitting diode device comprising:
    an epitaxial layer;
    a current blocking layer disposed at one side of the epitaxial layer and in contact with a portion of the epitaxial layer;
    a current spreading layer disposed at the side of the epitaxial layer and in contact with the current blocking layer;
    a substrate;
    a reflective layer disposed between the substrate and the current spreading layer; and
    an insulating thermoconductive layer disposed between the substrate and the reflective layer.

2. The light-emitting diode device according to claim 1, wherein: the epitaxial layer comprising a first semiconductor layer, a light-emitting layer and a second semiconductor layer disposed in sequence; and the second semiconductor layer comprises a micro-nano structure, and a portion of the micro-nano structure is in contact with the current spreading layer.

3. The light-emitting diode device according to claim 2, wherein the micro-nano structure comprises at least one nano-ball, nano-column, nano-hole, nano-point, nano-line, a nano-concave-convex structure, periodic hole or non-periodic hole.

4. The light-emitting diode device according to claim 2, wherein the current spreading layer is in contact with a portion of the current blocking layer and a portion of the second semiconductor layer.

5. The light-emitting diode device according to claim 4, further comprising:
   a first electrode electrically connected to an exposed portion of the epitaxial layer; and
   a second electrode electrically connected to the reflective layer.

6. The light-emitting diode device according to claim 1, wherein the current blocking layer comprises nitride, oxide, carbide, a dielectric material or an insulating material with high thermal-conductive coefficient.

7. The light-emitting diode device according to claim 1, wherein the current spreading layer comprises indium tin oxide, nickel/aluminum alloy, nickel oxide, aluminum-doped zinc oxide, zinc gallium oxide, antimony tin oxide or a transparent conductive material.

8. The light-emitting diode device according claim 1, wherein the epitaxial layer, the current blocking layer and the current spreading layer are disposed on the substrate.

9. The light-emitting diode device according to claim 8, further comprising an adhesive layer disposed at one side of the substrate, wherein the adhesive layer is capable of adhering at low temperature, or comprises a pure metal, an alloy, an electroconductive material, a non-electroconductive material, solder, an organic material or an adhesive agent.

10. The light-emitting diode device according to claim 1, wherein the reflective layer comprises platinum, gold, silver, palladium, nickel, chromium, titanium, chromium/aluminum alloy, nickel/aluminum alloy, titanium/aluminum alloy, titanium/silver alloy, chromium/platinum/aluminum alloy or a combination thereof.

11. The light-emitting diode device according to claim 10, wherein the insulating thermoconductive layer comprises nitride, oxide, carbide or a dielectric material.

12. The light-emitting diode device according to claim 1, further comprising a transparent conductive layer disposed at the other side of the epitaxial layer, wherein the transparent conductive layer comprises indium tin oxide, aluminum-doped zinc oxide, nickel/aluminum alloy, zinc oxide or zinc gallium oxide.

13. The light-emitting diode device according to claim 12, further comprising a protective layer in contact with the transparent conductive layer, a portion of the epitaxial layer or a portion of the current spreading layer, wherein the protective layer comprises micro-nano particles, nitride, oxide, carbide, a dielectric material or an insulating material with high thermoconductive coefficient.

14. The light-emitting diode device according to claim 13, further comprising:
   a first electrode electrically connected to the transparent conductive layer; and
   a second electrode electrically connected to the substrate or an exposed portion of the current spreading layer.

15. The light-emitting diode device according to claim 1, wherein the current blocking layer comprises a first micro-nano structure, and the second semiconductor layer comprises a second micro-nano structure corresponding to the first micro-nano structure.

16. The light-emitting diode device according to claim 15, wherein the first or second micro-nano structure comprises at least one nano-ball, nano-column, nano-hole, nano-point, nano-line, a nano-concave-convex structure, periodic hole or non-periodic hole.

17. A manufacturing method of a light-emitting diode device, comprising steps of:
   forming an epitaxial layer on a first substrate;
   forming a current blocking layer on the epitaxial layer;
   forming a current spreading layer on the current blocking layer and a portion of the epitaxial layer;
   forming a reflective layer on the current spreading layer;
   forming an adhesive layer on a second substrate;
   combining the second substrate with the reflective layer by the adhesive layer;
   removing the first substrate;
   forming a transparent conductive layer on the first semiconductor layer; and
   forming a protective layer on the transparent conductive layer or the current spreading layer.

18. The method according to claim 17, wherein the step of forming the epitaxial layer comprises:
   forming a first semiconductor layer on the first substrate;
   forming a light-emitting layer on the first semiconductor layer; and
   forming a second semiconductor layer on the light-emitting layer.

19. The method according to claim 18, further comprising a step of forming a first micro-nano structure on the current blocking layer by thin-film process, photolithograph process, etching process, electron beam writer processing, anodic aluminum oxidizing, or using micro-nano particles.

20. The method according to claim 19, further comprising a step of forming a second micro-nano structure on the second semiconductor layer corresponding to the first micro-nano structure, wherein the first micro-nano structure or the second micro-nano structure comprises at least one nano-ball, nano-column, nano-hole, nano-point, nano-line, a nano-concave-convex structure, periodic hole or non-periodic hole.

21. The method according to claim 17, wherein the current blocking layer is formed by stacking, sintering, anodic aluminum oxidizing, nano-imprinting, hot pressing, transfer printing, etching or electron beam writer processing.

22. The method according to claim 17, further comprising steps of:
   forming a first electrode electrically connecting to the transparent conductive layer; and
   forming a second electrode electrically connecting to the second substrate or the current spreading layer.

23. The method according to claim 22, further comprising a step of:
   forming an insulating thermoconductive layer between the reflective layer and the second substrate.

24. The method according to claim 23, further comprising a step of:
   removing a portion of the first semiconductor layer, a portion of the light-emitting layer, a portion of the second semiconductor layer and a portion of the current spreading layer so as to expose a portion of the current spreading layer.

25. A manufacturing method of a light-emitting diode device, comprising steps of:
   forming a first semiconductor layer on an epitaxial substrate;

forming a light-emitting layer on the first semiconductor layer;
forming a second semiconductor layer on the light-emitting layer, wherein the second semiconductor layer has a first micro-nano structure;
removing a portion of the second semiconductor layer and a portion of the light-emitting layer to expose a portion of the first semiconductor layer;
forming a current blocking layer to cover a portion of the second semiconductor layer, a portion of the light-emitting layer and a portion of the first semiconductor layer; and forming a current spreading layer on a portion of the second semiconductor layer and a portion of the current blocking layer.

26. The method according to claim 25, further comprising steps of: forming a reflective layer on the current spreading layer; and forming a first electrode on the exposed portion of the first semiconductor layer, and a second electrode on the reflective layer.

* * * * *